United States Patent
Taddiken

(10) Patent No.: US 7,148,539 B2
(45) Date of Patent: Dec. 12, 2006

(54) SEMICONDUCTOR STRUCTURE HAVING A COMPENSATED RESISTANCE IN THE LDD AREA AND METHOD FOR PRODUCING THE SAME

(75) Inventor: Hans Taddiken, München (DE)

(73) Assignee: Infineon Technologies AG, Munich (DE)

( * ) Notice: Subject to any disclaimer, the term of this patent is extended or adjusted under 35 U.S.C. 154(b) by 181 days.

(21) Appl. No.: 10/826,921

(22) Filed: Apr. 16, 2004

(65) Prior Publication Data

US 2004/0262691 A1   Dec. 30, 2004

Related U.S. Application Data

(63) Continuation of application No. PCT/EP02/09702, filed on Aug. 30, 2002.

(30) Foreign Application Priority Data

Oct. 17, 2001   (DE) ............... 101 51 202

(51) Int. Cl.
*H01L 29/76*   (2006.01)

(52) U.S. Cl. .......... 257/336; 257/344; 257/492; 257/493

(58) Field of Classification Search ........... 257/492, 257/493, 927, 292
See application file for complete search history.

(56) References Cited

U.S. PATENT DOCUMENTS 6,207,994 B1 *  3/2001  Rumennik et al. ........... 257/342
6,756,636 B1 *  6/2004  Onishi et al. ............... 257/342

OTHER PUBLICATIONS

Gebara, Edward, Niklas Rorsman, Jörgen Olsson, Herbert Zirath, Klas Håkan Eklund, "Output Power Characteristics of High Voltage LDMOS Transistors," Proceedings of the 5th Symposium on Gigahertz Electronics, Goeteborg, Sweden, Mar. 2000, pp. 75-78, (4 pages).
Disney, D. R., A. K. Paul, M. Darwish, R. Basecki, V. Rumennik, "A New 800V Lateral MOSFET With Dual Conduction Paths," Proceedings of the 13th International Symposium on Power Semiconductor Devices & ICs, Osaka, Japan, Jun. 2001, pp. 399-402, (4 pages).
Cai, Jun, Changhong Ren, N. Balasubramanian, Johnny K. O. Sin, "A Novel High Performance Stacked LDD RF LDMOSFET," IEEE Electron Device Letters, vol. 22, No. 5, May 2001, (3 pages).
Söderbärg, A., B. Edholm, J. Olsson, F. Masszi and K. H. Eklund, "Integration of a Novel High-Voltage Giga-Hertz DMOS Transistor into a Standard CMOS Process," IEEE, 1995, pp. 38.5.1-38.5.4, (4 pages).

* cited by examiner

*Primary Examiner*—Jerome Jackson
*Assistant Examiner*—José R. Díaz
(74) *Attorney, Agent, or Firm*—Maginot, Moore & Beck

(57) ABSTRACT

A semiconductor structure includes a substrate, a source area formed in the substrate and a drain area formed in the substrate and comprising a doping of a first conductivity type. The drain area includes a first drain portion with a first doping concentration and a second drain portion with a second doping concentration, wherein the first doping concentration is higher than the second doping concentration. In the second drain portion a first region is formed comprising a doping of a second conductivity type which is different to the first conductivity type. Further, a second region is formed in the substrate below the second drain portion comprising a doping of the first conductivity type. A channel area is provided in the substrate between the source area and the second drain portion.

19 Claims, 3 Drawing Sheets

③ 26v_2e+12_300kv_7degrees_Pinch_0_18kv_0_0
④ 26v_2e+12_300kv_7degrees_Pinch_1e+12_18kv_0_0
② 26v_0_150kv_7degrees_Pinch_1e+12_18kv_0_0
① 26v_0_150kv_7degrees_Pinch_0_18kv_0_0

③ Ubd_2e+12_300kv_7degrees_Pinch_0_18kv_0_0
④ Ubd_2e+12_300kv_7degrees_Pinch_1e+12_18kv_0_0
② Ubd_0_150kv_7degrees_Pinch_1e+12_18kv_0_0
① Ubd_0_150kv_7degrees_Pinch_0_18kv_0_0

SEMICONDUCTOR STRUCTURE HAVING A COMPENSATED RESISTANCE IN THE LDD AREA AND METHOD FOR PRODUCING THE SAME

CROSS-REFERENCE TO RELATED APPLICATIONS

This application is a continuation of co-pending International Application No. PCT/EP02/09702, filed Aug. 30, 2002, which designated the United States and was not published in English.

BACKGROUND OF THE INVENTION

1. Field of the Invention

The present invention relates to a semiconductor structure having a compensated resistance in an LDD area and to a method for producing the same, in particular to a semiconductor structure having a compensated resistance in an LDD area. The present invention relates in particular to MOS transistors (MOS=metal oxide semiconductor) wherein between a source area and a drain area a lightly doped drain area is provided which is referred to as an LDD area (LDD=lightly doped drain). In particular, the present invention relates to LDMOS transistors and the production of the same (LDMOS=lateral diffused MOS).

2. Description of the Related Art

In MOS transistors for high power applications or in LDMOS transistors for high-frequency power applications between the gate structure and the drain area the LDD area is generated, e.g. by an implantation. In LDMOS transistors before the generation of the source area on the source side of the gate the required channel implantation is introduced which is then diffused under the gate structure in a subsequent temperature step.

Preferably, in LDMOS transistors for high frequency power applications, on the side of the gate structure facing the drain area, a longer n-doped LDD area is implanted. There are continuous trials to improve the performance of such an LDMOS transistor. An improvement of the performance is for example achieved by an increase of the breakdown voltage or by an improvement of the high frequency characteristics, for example by shielding the gate structure against the drain area. In order to achieve this, the prior art proposes to implant a flat buried area having a p-doping in the n-doped LDD area. This is for example described by H. Söderbärg et al. in "Integration of a Novel High-Voltage Giga-Hertz DMOS Transistor into a Standard CMOS Process", IEEE IEDM Washington 1995, pp. 975–978 and by E. Gebara et al. in "Output Power Characteristics of High Voltage LDMOS Transistors", GHz 2000 Symp. 5th Symp. on Giga-Hertz-Electronics, Proc., Göteborg, p. 13, 14$^{th}$ Mar. 2000, pp. 78—78.

The disadvantage of the preceding methods is that by implantation of the p-region the resistance of the LDD area is increased which is compensated by a correspondingly suitable increase of the doping of the LDD area and by introducing an additional n-doping in the LDD area in the area of the p-region.

In the prior art, a deep LDD area is used which additionally reaches far below the gate structure. The deep LDD area results in the fact that the additionally introduced doping in the p-region only represents a relatively low counter doping to the n-doping of the LDD area, so that the resistance of the LDD area in the area of the p-region only slightly increases. Further, above the p-region an additional n-doping is introduced, so that the p-region is completely buried in the LDD area.

It is a disadvantage of the deep LDD area that the same reaches far below the gate structure which leads to an increase of the drain-gate-capacity which is in particular undesirable in the RF area. However, this deep LDD area which therefore reaches below the gate structure may not be omitted in order to guarantee the shielding of the gate structure with a simultaneous compensation of the resistance increase due to the p-region. Suggestions for a compensation of the resistance increase in comparatively flat LDD areas which do not reach below the gate structure and therefore comprise a low gate-drain-capacity are not known in the prior art.

SUMMARY OF THE INVENTION

It is the object of the present invention to provide an improved semiconductor structure and a method for producing the same, whereby a semiconductor structure is obtained comprising improved characteristics, in particular in the RF area.

According to a first aspect, the present invention provides a semiconductor structure having a substrate, a source area formed in the substrate and a drain area also formed in the substrate. The drain area has a doping of a first conductivity type and includes a first drain portion with a first doping concentration and a second drain portion with a second doping concentration. The first doping concentration is higher than the second doping concentration. Further, in the second drain portion a first region is formed comprising a doping of a second conductivity type which is different from the first conductivity type. The semiconductor structure further includes a second region formed in the structure below the second drain portion and comprising a doping of the first conductivity type. Further, between the source area and the second drain portion a channel area is established in the substrate.

According to a second aspect, the present invention further provides a method for producing a semiconductor structure in which first a gate structure on a substrate is generated, a source area with a doping of a first conductivity type in the substrate is generated and a drain area with a doping of the first conductivity type in the substrate is generated. The drain area is generated by forming a first drain portion with a first doping concentration and a second drain portion with a second doping concentration which is lower than the first doping concentration, wherein the second drain portion is formed between the first drain portion and the gate structure. Further, a first region in the second drain portion is generated by introducing a doping of a second conductivity type into the second drain portion, and a second region is generated below the drain portion in the substrate by introducing a doping of the first conductivity type.

According to the present invention, a semiconductor structure is provided in which the LDD area substantially does not extend below the gate structure, so that a high gate-drain-capacity is prevented.

This is preferably achieved by the fact that the generation of the LDD area, e.g. by implantation, is only performed after the gate structuring. Instead of the initial structuring of the gate structure also a corresponding masking may be provided, so that an implantation in this case may be performed before the gate structuring. Further, other measures known in the prior art may be used in order to guarantee that an LDD area basically only abuts on the gate structure, however, does not reach below the gate structure.

The generation of the LDD area, e.g. by implantation, after the gate structuring leads to a flat LDD area, so that the additional p-region also needs to be flat for improving the characteristics of the LDMOS transistor. As a result of this, the resistance of the LDD area in the area of the p-region strongly increases. In order to compensate for this increase, an additional n-region is required which is preferably generated using the same mask as the p-region. In contrast to the prior art, the additional n-region is generated below the LDD area in the substrate, e.g. by implantation, so that the LDD area is extended to the bottom (in the direction of the substrate) in these areas.

According to one embodiment, the p-region of the LDD area remains floating, i.e. is not connected to a potential. According to another embodiment, the p-region is connected to a reference potential, e.g. mask, whereby a defined charge carrier degradation is achieved.

It is the advantage of the present invention that in the area of the gate structure a flat LDD area is generated which does not extended below the gate structure, so that the gate-drain-capacity is held low.

In contrast to the methods known in the prior art, here in addition to the initial LDD area an additional n-region is introduced below the original LDD area in order to compensate for the resistance increase of the LDD area in the area of the p-region. In contrast to the prior art, the p-doping of the p-region in the flat LDD area represents a substantial counter-doping which is compensated by the inventive approach. In contrast to the prior art, the additional n-region is arranged below the p-region and below the LDD area, i.e. in the substrate. Whereby, compared to the prior art, a comparatively flat LDD area is enabled.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
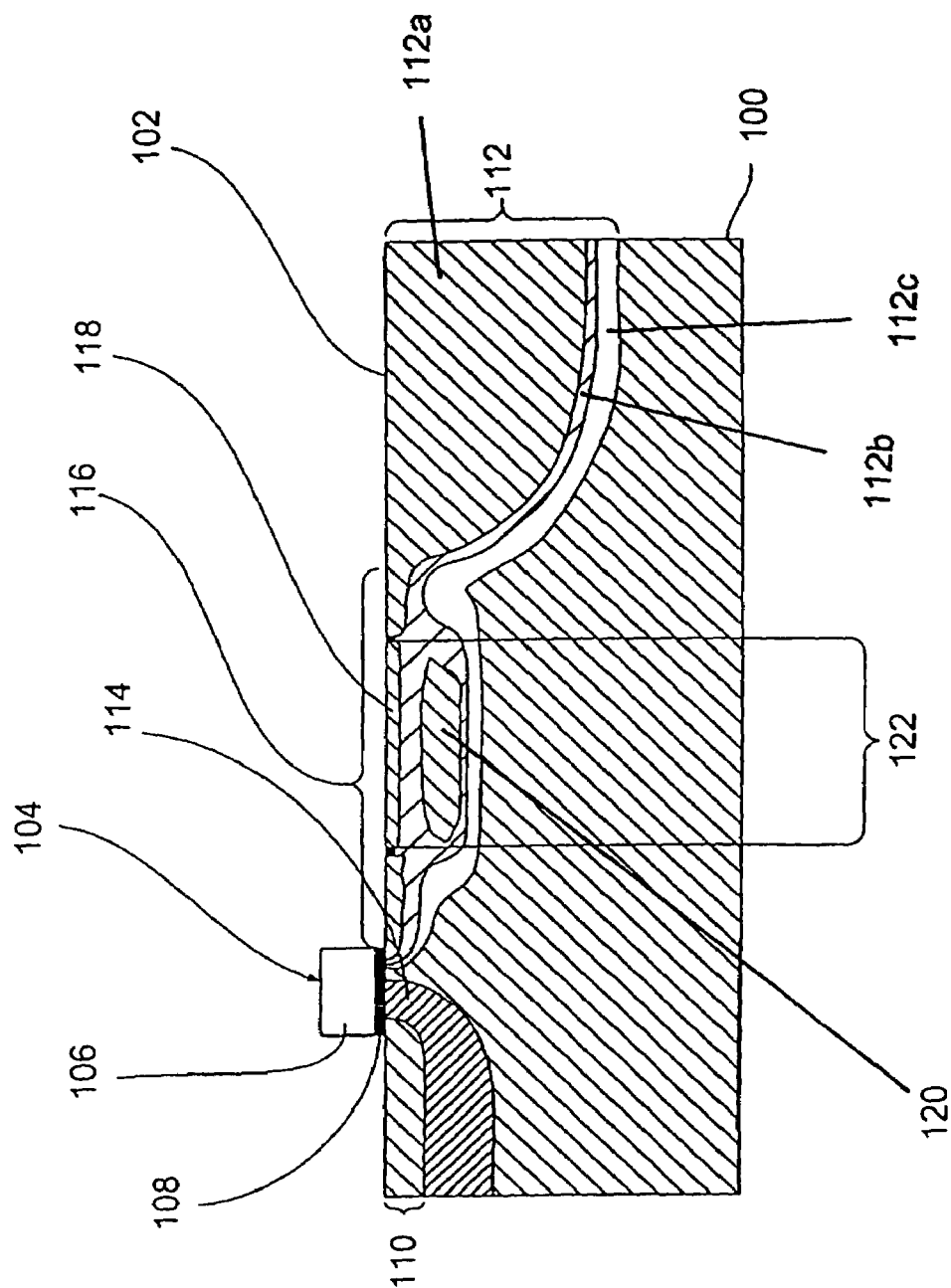
FIG. 1 shows an illustration of an LDMOS transistor having a dual implanted LDD area according to the present invention.

In FIG. 1 an LDMOS transistor with a p/n-dual implantation in the LDD area is illustrated according to the present invention. The LDMOS transistor is formed in a substrate 100 which is for example a p-substrate. In FIG. 1, only the substrate 100 is illustrated, however, according to the present invention, the term "substrate" also relates to a structure including a substrate layer and an epitaxy layer on the substrate layer.

The substrate 100 has a p-doping of about $3 \times 10^{15}$ 1/cm³. On a surface 102 of the substrate 100 a gate structure 104 is formed including a gate polysilicon 106 and a gate oxide 108 arranged between the gate polysilicon 106 and the substrate 100. Within the substrate 100 further an n⁺-source area 110 and an n⁺-drain area 112 is formed. The regions 112a, 112b, 112c indicated drain area regions with different doping concentrations. Below the gate oxide 108 a laterally diffused channel area 114 is formed comprising a p-doping in the area of about $2 \times 10^{17}$ 1/cm³. The source area 110 and the drain area respectively comprise n-dopings of about $2 \times 10^{20}$ 1/cm³.

Between the gate structure 104 and the drain area 112 an LDD area 116 is formed e.g. by implantation comprising a doping concentration which is lower than the doping concentration of the drain area. In the illustrated embodiment, the doping concentration of the LDD area is at about $1 \times 10^{17}$ 1/cm³.

For improving the performance of the LDMOS transistor, a p-region 118 is formed in the LDD area 116, e.g. by implantation, having a p-doping dose of approx. $1 \times 10^{12}$ 1/cm².

In order to prevent a resistance increase due to the introduced flat p-region 118 in the LDD area 116 of the LDMOS transistor, a further n-region 120 is provided lying below the p-region 118 and below the LDD area, i.e. in the substrate. The doping of the further n-region 120 is preferably performed with a dose of about $2 \times 10^{12}$ 1/cm².

At 122 in FIG. 1 the area of the dual implantation in the LDMOS transistor is exemplified.

In the embodiment illustrated in FIG. 1, the implantation of the LDD area 116 was performed before the deposition of the polymaterial of the gate structure 106. The LDD area 116 is generated by implantation of arsenic (As) at 80 keV with a dose of about $1.3 \times 10^{12}$ 1/cm². The p-region 118 is generated by implantation of boron (B) at 18 keV with a dose of about $1 \times 10^{12}$ 1/cm². Both implantations are performed at an angle of 0° with regard to the normal on the substrate surface 102.

The further n-region 120 is generated by an implantation of phosphorus (P) at 300 keV with a dose of about $2 \times 10^{12}$ 1/cm². The implantation was performed at an angle of 7° with regard to the normal on the substrate surface 102 and the substrate (wafer disc) was rotated four times during the implantation ("quad mode"), in order to thus guarantee a uniform generation of the implantation of the n-region 120.

During production the implantation of the n-region 120 is performed using the same mask which was used for the implantation of the p-region. This leads to the defined area 122 shown in FIG. 1.

In one alternative embodiment, the LDD area 116 may be generated by an implantation of phosphorus (P) at 100 keV with a dose of about $1.2 \times 10^{12}$ 1/cm².

Although in FIG. 1 the p-region 118 is shown exposed at the surface 102 of the substrate, the p-region may also be completely embedded in the LDD area 116.

According to one embodiment of the present invention, the p-region 118 is connected to no reference potential, i.e. is "floating". In another embodiment, the p-region 118 may be connected to a reference potential, e.g. to ground, whereby a defined charge decomposition may be achieved.

Figure 2:
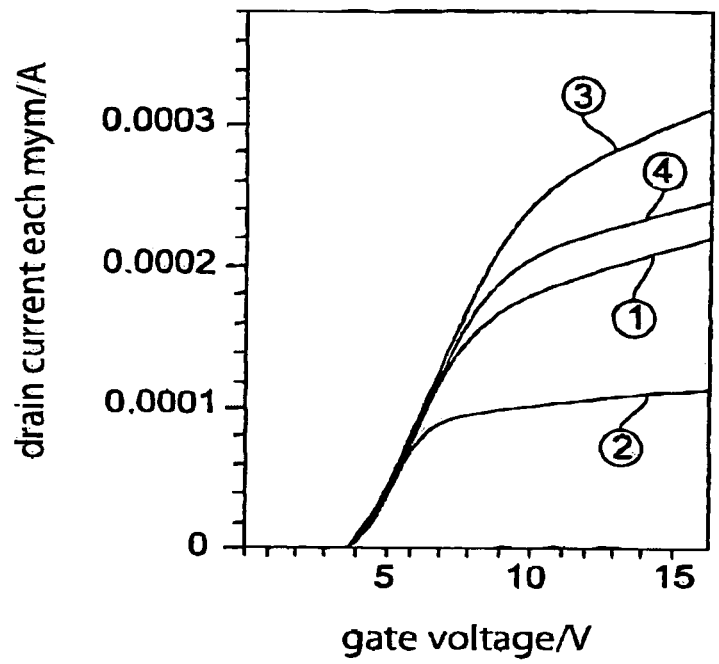
FIG. 2 shows a graph representing the input characteristic line of the LDMOS transistor of FIG. 1 for different implantations in the LDD area.

With reference to FIG. 2, the improvement of the input characteristic line is illustrated by the inventive dual implantation in the flat LDD area 116. In FIG. 2, the gate voltage is plotted versus the drain current, wherein four curves 1 to 4 are shown. The curves shown in FIG. 2 were determined for a drain voltage of 26 Volt and show the dependence of the drain current on the applied gate voltage.

Curve 1 shows the course of the input characteristic line after only the LDD area 116 has been implanted.

Curve 2 shows the course of the input characteristic line after the additional p-region 118 was implanted into the LDD area 116. As it may be seen, hereby the characteristic line is lowered, as due to the p-region 118 the resistance in the LDD area 116 is increased and so the drain current compared to the LDD area correspondingly decreases without an additional p-region 118 (curve 1).

Curve 3 shows a simulation in which in addition to the LDD-area 116 only the further n-region 120 was introduced below the LDD area.

Curve 4 indicates the course of the input characteristic line, as it is obtained for an LDMOS transistor according to FIG. 1, wherein in the LDD area 116 the p-region 118 is implanted and the n-region 120 is introduced below the LDD area 116. As it may be seen, despite the additional p-region 118 in the LDD area 116 (which invariably leads to an increase of the resistance (see curve 2)) the presence of the further n-region 120 prevents the undesired resistance increase. Even an improvement of the input characteristic line (curve 4) compared to the LDD area is achieved without additional n-implantation (curve 1).

It is therefore to be noted that by the inventive approach of providing an additional n-region 120 below the LDD area, the resistance increase due to the p-region 118 may be prevented. The presence of this additional n-region 120 permits the advantageous effects of the p-region 118 in the LDD area 116, i.e. the shielding of the gate structure to be recognized without disadvantageous limitations of the characteristics of the RF transistor.

Figure 3:
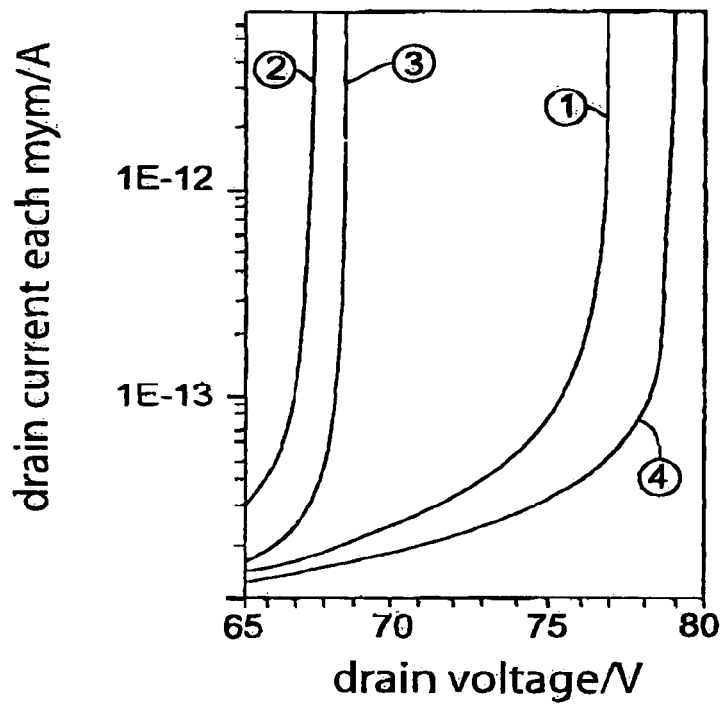
FIG. 3 shows a graph representing the breakdown characteristic line of the LDMOS transistor of FIG. 1 for different implantations in the LDD area.

FIG. 3 is a graphical illustration of the breakdown characteristic line wherein the drain current is plotted versus the drain voltage.

Just like in FIG. 2, curve 1 designates the course of the breakdown characteristic line in an LDMOS transistor which only comprises the LDD area 116.

Curve 2 shows the course of the breakdown characteristic line of an LDMOS transistor with an LDD area 116 in which a p-region 118 was implanted.

For comparative purposes, curve 3 shows the course of the breakdown characteristic line for an LDD area 116 below which a further n-region 120 was introduced.

Curve 4 shows the course of the breakdown characteristic line of an LDMOS transistor wherein the p-region 118 is introduced in the LDD area 116 and below the LDD area 116 the further n-region 120 is introduced.

As it may be seen from a comparison of curves 1 and 2, by the introduction of the p-region 118 into the LDD area 116 the breakdown voltage is substantially reduced, from about 76 Volt to about 67 Volt. This reduction of the breakdown voltage may be compensated and even improved by the additional n-region 120 below the LDD area 116, as is illustrated by curve 4, in which the breakdown voltage may be increased to about 79 Volts.

With regard to FIGS. 2 and 3 it is to be noted that here an LDMOS transistor according to FIG. 1 was assumed, in which the LDD area 116 was generated by an implantation of arsenic (As) at about 80 keV with a dose of $1.3 \times 10^{12}$ $1/cm^2$, wherein the implantation is performed before the deposition of the gate polysilicon 106. The p-region 118 was generated by an implantation of boron (B) at about 18 keV with a dose of about $1 \times 10^{12}$ $1/cm^2$. The further n-region was generated by an implantation of phosphorus (P) at about 300 keV with a dose of about $2 \times 10^{12}$ $1/cm^2$. The implantation is performed at an angle of about 7° with regard to the normal on the surface 102, wherein the disc was rotated four times according to the so called "quad mode".

Although the above description of the preferred embodiments of the present invention was performed using an LDMOS transistor having an LDD area, it is noted, that the inventive method may also be applied for MOS transistors comprising an LDD area.

The present invention is not restricted to the above-described materials. Instead of the illustrated p-substrate 100, p-region 118, n-source area 110, n-drain area 112, n-LDD area 116 and a further n-region 120 complementary materials may be used, i.e. an n-substrate 100, an n-area 118; a p-source area 110, a p-drain area 112, a p-LDD area 116 and a further p-region 120 may be used to form a semiconductor.

Further, the invention is not restricted to the implantation of the above-mentioned materials for the generation of the respective areas in the substrate. Other known technologies may also be used.

While this invention has been described in terms of several preferred embodiments, there are alterations, permutations, and equivalents which fall in the scope of this invention. It should also be noted that there are many alternative ways of implementing the methods and compositions of the present invention. It is therefore intended that the following appended claims be interpreted as including all such alterations, permutations, and equivalents as fall in the true spirit and scope of the present invention.

What is claimed is:

1. A semiconductor structure, comprising:
   a substrate;
   a source area formed in the substrate;
   a drain area formed in the substrate and comprising a doping of a first conductivity type, wherein the drain area comprises a first drain portion having a first doping concentration and a second drain portion having a second doping concentration, wherein the first doping concentration is higher than the second doping concentration, wherein the second drain portion includes a first region comprising a doping of a second conductivity type which is different to the first conductivity type;
   a second region formed in the substrate below the second drain portion and comprising a doping of the first conductivity type; and
   a channel area in the substrate between the source area and the second drain portion,
   wherein the doping concentration of the second region is higher than the doping concentration of the second drain portion.

2. The semiconductor structure according to claim 1, wherein the second region in the substrate is formed such that the second region is substantially opposite to the first region in the second drain portion.

3. The semiconductor structure according to claim 1, wherein the first region is embedded in the second drain portion.

4. The semiconductor structure according to claim 1, wherein the first region is formed in the second drain portion such that the first region is exposed at a surface of the substrate.

5. The semiconductor structure according to claim 1, wherein the first region is floating.

6. The semiconductor structure according to claim 1 wherein the first region is connected to a reference potential.

7. A semiconductor comprising:
   a substrate;
   a source area formed in the substrate and having a doping of a first conductivity type;
   a drain area formed in the substrate and displaces from the source area, the drain area comprising a first drain portion having a doping of the first conductivity type and a first doping concentration and a second doping concentration lower than the first doping concentration, the second drain portion being disposed between the first drain portion and the source area;

a first region formed in the second drain region, the first region having a doping of a second conductivity type which is different than the first conductivity type;

a second region formed below the second drain region and having a doping of the first conductivity type; and a channel area in the substrate between the source area and the drain area, wherein the second region has a doping concentration higher than the second drain portion.

8. The apparatus of claim 7 wherein the second region is disposed substantially below the first region in the substrate.

9. The apparatus of claim 8 wherein the second region does not extend below the channel area.

10. The apparatus of claim 8 and further comprising a gate structure formed on a surface of the substrate above the channel and wherein the second drain portion does not extend substantially below the gate structure.

11. The apparatus of claim 7 wherein the second drain portion is substantially flat.

12. The apparatus of claim 11 wherein the first region is embedded in the second drain portion and the depth and doping concentration of the second region compensates for the increased resistance resulting in the second drain portion resulting from the depth and doping concentration of first region embedded therein.

13. The apparatus of claim 8 wherein the first region and second region form an area of dual implantation.

14. The apparatus of claim 8 wherein the depth and doping concentration of the second region compensates for the increased resistance resulting in the second drain portion resulting from the depth and doping concentration of first region disposed therein.

15. The apparatus of claim 8 wherein the second drain portion is flat.

16. A semiconductor comprising:

a substrate;

a source area formed in the substrate and having a doping of a first conductivity type;

a drain area formed in the substrate and displaced from the source area, the drain area comprising a first drain portion having a doping of the first conductivity type and a first doping concentration and a second drain portion having a doping of the first conductivity type and a second doping concentration lower than the first doping concentration, the second drain portion being disposed between the first drain portion and the source area;

a first region formed in the second drain region, the first region having a doping of a second conductivity type which is different than the first conductivity type;

a second region formed below the second drain region and having a doping of the first conductivity type;

a channel area in the substrate between the source area and the drain area; and a gate structure formed on a surface of the substrate above the channel area, wherein the second drain portion is disposed substantially below the first region in the substrate and does not extend substantially below the gate structure, and wherein the doping concentration of the second region is higher than the doping concentration of the second drain portion.

17. The apparatus of claim 16 wherein the first region and second region form an area of dual implantation.

18. The apparatus of claim 16 wherein the depth and doping concentration of the second region compensates for the increased resistance resulting in the second drain portion resulting from the depth and doping concentration of first region disposed therein.

19. The apparatus of claim 8 wherein the second drain portion is flat.

* * * * *